United States Patent [19]

Akagiri

[11] 4,370,681

[45] Jan. 25, 1983

[54] GAIN CONTROL CIRCUIT FOR NOISE REDUCTION SYSTEM

[75] Inventor: Kenzo Akagiri, Kanagawa, Japan

[73] Assignee: Sony Corporation, Tokyo, Japan

[21] Appl. No.: 151,363

[22] Filed: May 19, 1980

[30] Foreign Application Priority Data

May 29, 1979 [JP] Japan .................................. 54-65563

[51] Int. Cl.³ .......................... G11B 5/02; G11B 5/45; G11B 15/02
[52] U.S. Cl. ....................................... 360/68; 360/24; 360/65
[58] Field of Search ........................ 360/68, 24, 25, 65

[56] References Cited

U.S. PATENT DOCUMENTS

| | | | |
|---|---|---|---|
| 4,169,219 | 9/1979 | Beard | 360/67 |
| 4,187,477 | 2/1980 | Endoh et al. | 360/67 |
| 4,263,624 | 4/1981 | Gundry | 360/65 |

Primary Examiner—Vincent P. Canney

Attorney, Agent, or Firm—Lewis H. Eslinger; Alvin Sinderbrand

[57] ABSTRACT

A gain control circuit for an audio signal recorder includes a first transmission path having a variable gain amplifier for compressing an audio signal with a first gain characteristic in response to a first control voltage supplied thereto, a second transmission path having a variable gain amplifier for compressing the audio signal with a second gain characteristic different from the first gain characteristic in response to a second control voltage supplied thereto, a control circuit responsive to at least one of the compressed audio signals from the variable gain amplifiers for producing the control signals, and an adding amplifier for adding the compressed audio signals from the first and second transmission paths whereby the compressed audio signal from the first transmission path is effectively transmitted for recording when the level of the audio signal is below a predetermined value and the compressed audio signal from the second transmission path is effectively transmitted for recording when the level of the audio signal is above the predetermined value.

18 Claims, 24 Drawing Figures

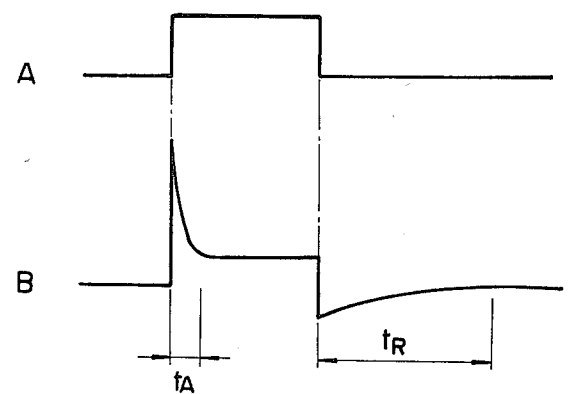
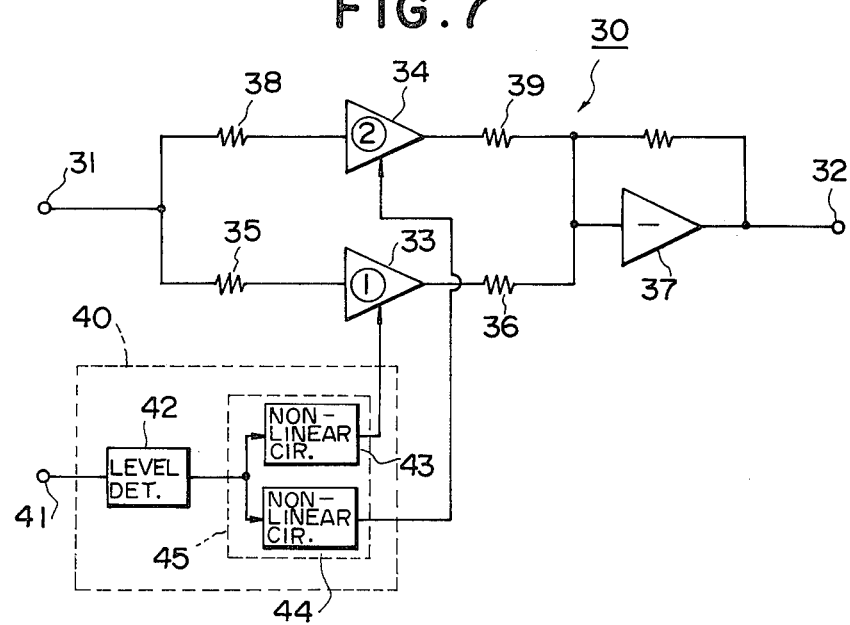

GAIN CONTROL CIRCUIT FOR NOISE REDUCTION SYSTEM

BACKGROUND OF THE INVENTION

1. Field of the Invention

This invention relates generally to information signal recording and reproducing apparatus and, more particularly, is directed to a gain control circuit for reducing the noise accompanying a reproduced information signal in an information signal recording and reproducing apparatus.

2. Description of the Prior Art

Noise reduction systems for reducing noise and distortion which accompany a reproduced information signal, for example, in an audio tape recorder, are well-known in the art. Such noise reduction systems are designed to increase the dynamic range of the signal that can be recorded and reproduced from a recording medium such as a magnetic tape. The existing noise reduction systems generally involve an encoding process which compresses the level of the information signal and amplifies the high frequency components thereof prior to recording the signal on the recording medium. A decoding process is employed during the reproducing operation which is complementary to the compression and amplification which occur during the recording operation. In other words, the decoding process results in an expansion of the level of the reproduced information signal and an attenuation of the high frequency components thereof.

In one known noise reduction system, during the recording operation, the information signal is first transmitted through a pre-emphasis circuit which is provided with a large gain for pre-emphasizing the high frequency components of the signal supplied thereto. The pre-emphasized signal from the pre-emphasis circuit is then supplied to a compression circuit which compresses the pre-emphasized signal and which, for example, may include a variable gain amplifier, such as a voltage controlled amplifier, acting on the output from the pre-emphasis circuit. A control signal for varying the gain of the variable gain amplifier is derived from a level detecting circuit in response to the output from the variable gain amplifier. The control signal from the level detecting circuit results in the variable gain amplifier imparting a compression characteristic to the information signal. Complementary de-emphasis and expansion circuitry are provided to act on the reproduced information signal during the reproducing operation.

However, there are certain disadvantages with such noise reduction system. For example, the described noise reduction system exhibits a poor transient characteristic for changes in the level of the information signal. In particular, the compression circuit of the noise reduction system fails to adequately respond when the level of the information signal is abruptly increased, resulting in overshoots being created in the information signal. This occurs because the gain of the variable gain amplifier cannot instantaneously change with changes in the signal level with the result that the large gain normally applied to low level signals is applied to the high level signals for a short time when the level of the information signal abruptly rises from a low to a high level. This results in a so-called "noise breathing" phenomenon. The overshoots in the level of the information signal result in a distorted waveform being recorded and reproduced from the recording medium due to magnetic saturation of the recording tape.

OBJECTS AND SUMMARY OF THE INVENTION

Accordingly, it is a principal object of this invention to provide a gain control circuit for an information signal recording and reproducing apparatus that avoids the above-described difficulties encountered with the prior art.

More particularly, it is an object of this invention to provide a gain control circuit for reducing the noise generally accompanying a reproduced information signal in an information signal recording and reproducing apparatus.

It is another object of this invention to provide a gain control circuit for an information signal recording and reproducing apparatus which requires minimal adjustment of the various elements thereof so as to obtain matching gain characteristics for the input and output gain control portions of the gain control circuit according to this invention.

It is still another object of this invention to provide a gain control circuit for an information signal recording and reproducing apparatus in which the information signal is compressed during the recording operation and expanded during the reproducing operation by respective first transmission paths when the level of the information signal supplied thereto is lower than a predetermined value and in which the information signal is compressed and expanded by respective second transmission paths during the recording and reproducing operations when the level of the information signal is greater than the predetermined value.

It is yet another object of this invention to provide a gain control circuit for an information signal recording and reproducing apparatus in which overshoots in the information signal and resulting magnetic saturation of the magnetic recording tape are substantially eliminated.

It is a further object of this invention to provide a gain control circuit for an information signal recording and reproducing apparatus in which complementary matching of the compression and expansion circuits thereof is easily obtained.

It is a still further object of this invention to provide a gain control circuit for an information signal recording and reproducing apparatus, as aforesaid, which is of relatively simple construction, and which may be conveniently employed in the recording and reproducing circuits of an audio tape recording and reproducing apparatus.

In accordance with an aspect of this invention, in apparatus for recording an information signal on a recording medium by a transducer, gain control means comprises means defining a first transmission path for compressing the information signal with a first input-output characteristic, means defining a second transmission path for compressing the information signal with a second input-output characteristic different from said first input-output characteristic, and means for effectively supplying the compressed information signal from said first transmission path to the transducer when the level of the information signal is below a predetermined value and for effectively supplying the compressed information signal from said second transmission path to the transducer when the level of the information signal is above the predetermined value so as to produce a substantially linear input-output compression characteristic for said gain control means. In addition, in the reproducing operation of the transducer complementary gain control means is provided for the output thereof for complementary expanding of the reproduced information signal with a substantially linear input-output expansion characteristic for exactly reproducing the original information signal that had been supplied to the input gain control means.

The above, and other, objects, features and advantages of the invention, will be apparent in the following detailed description of the illustrative embodiments of the invention which is to be read in connection with the accompanying drawings.

BRIEF DESCRIPTION OF THE DRAWINGS

FIG. 6A is a waveform diagram illustrating changes in the signal level of an input information signal;

FIG. 6B is a waveform diagram illustrating changes in the level of the signal of FIG. 8A when transmitted through the gain control circuits of FIGS. 1 and 4;

FIG. 7 is a block-circuit wiring diagram of a compression circuit of a gain control circuit according to one embodiment of the present invention.

DETAILED DESCRIPTION OF THE PREFERRED EMBODIMENTS

Figure 1:
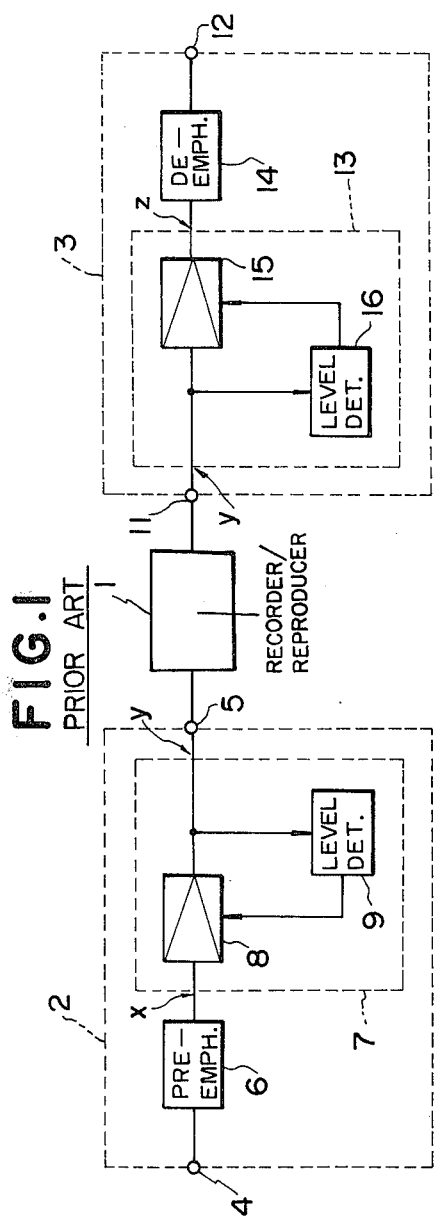
FIG. 1 is a block diagram of a gain control circuit for a noise reduction system according to the prior art.
Figure 2:
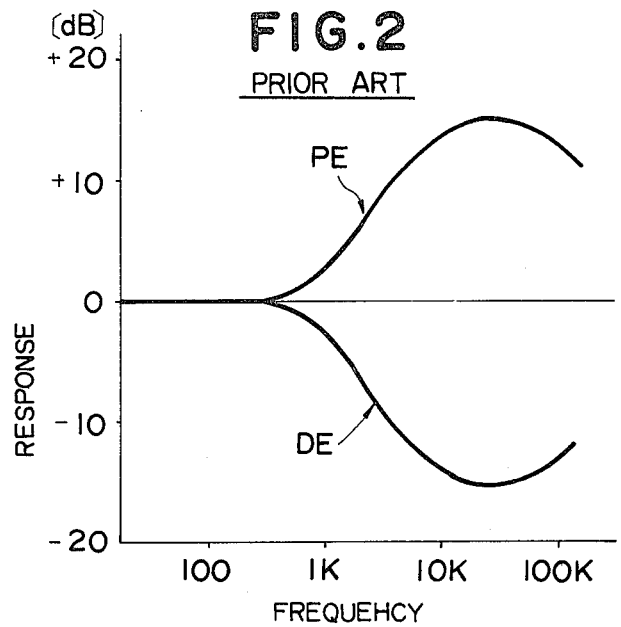
FIG. 2 is a graphical diagram illustrating the pre-emphasis and de-emphasis frequency characteristics for the gain control circuit of FIG. 1.

Referring to the drawings in detail, and initially to FIG. 1 thereof, it will be seen that, in a gain control circuit for an information signal recording and reproducing apparatus according to the prior art, as there illustrated, an information signal is supplied to an input terminal 4 of an input gain control or encoder circuit 2 for removing certain high frequency components of the signal, such as noise or the like. Encoder circuit 2 includes a pre-emphasis circuit 6 supplied with the information signal from input terminal 4 and having a large gain for pre-emphasizing the high frequency components of the information signal, as illustrated by curve PE of FIG. 2. The output from pre-emphasis circuit 6 is supplied to a compression circuit 7 of encoder circuit 2 and, more particularly, to a variable gain amplifier 8, such as a voltage controlled amplifier, of compression circuit 7. It should be appreciated that, although pre-emphasis circuit 6 is shown in FIG. 1 to be positioned before compression circuit 7, this order may be reversed without changing the effect on the signal. Compression circuit 7 further includes a level detecting circuit 9 which detects the level of the output from variable gain amplifier 8 and produces a DC control voltage in response thereto which is supplied to variable gain amplifier 8 for varying the gain thereof. The input-ouput level characteristic for compression circuit 7 is shown by curve R in FIG. 3 where it it seen that the input information signal x supplied thereto is compressed in a substantially linear manner on a logarithmic graph.

Figure 4:
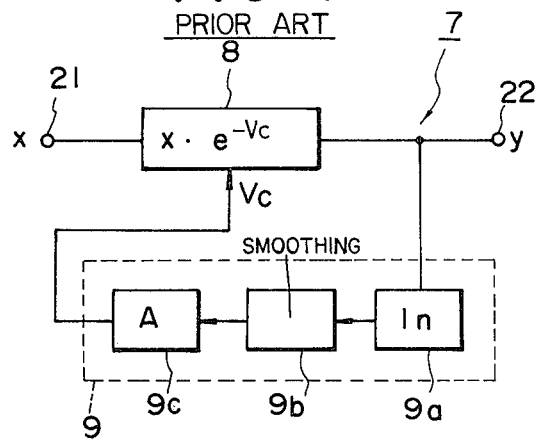
FIG. 4 is a block diagram of a known compression circuit that may be used in the gain control circuit of FIG. 1.

Referring now to FIG. 4, there is shown one embodiment of a known compression circuit 7 which is used in the prior art gain control circuit of FIG. 1. As shown therein, variable gain amplifier 8 produces an output signal y which can be represented as follows:

$$y = x \cdot e^{-V_c} \qquad (1)$$

where $V_c$ is the control voltage supplied to variable gain amplifier 8 from level detecting circuit 9. Detecting circuit 9 includes a natural logarithmically converting circuit 9a which is supplied with the output from variable gain amplifier 8 and, in turn, supplies a natural logarithmically converted signal to a smoothing circuit 9b. The signal from this latter circuit is amplified by an amplifier 9c having a gain A and which is also included in level detecting circuit 9. Amplifier 9c thereby supplies control voltage $V_c$ which can be represented as follows, to variable gain amplifier 8:

$$V_c = A \cdot \ln y = \ln y^A \qquad (2)$$

Equations (1) and (2) can be combined to form a simplified expression for output signal y as follows:

$$y = x \cdot e^{-V_c} = x \cdot e^{-\ln y^A} \qquad (3)$$
$$= x \cdot y^{-A}$$
$$y^{1+A} = x$$
$$y = x^{\frac{1}{1+A}}.$$

If input signal x and output signal y are transformed into their decibel or logarithmic equivalent, output signal y can be represented as follows:

$$\log y = \frac{1}{1+A} \log x. \qquad (4)$$

Figure 3:
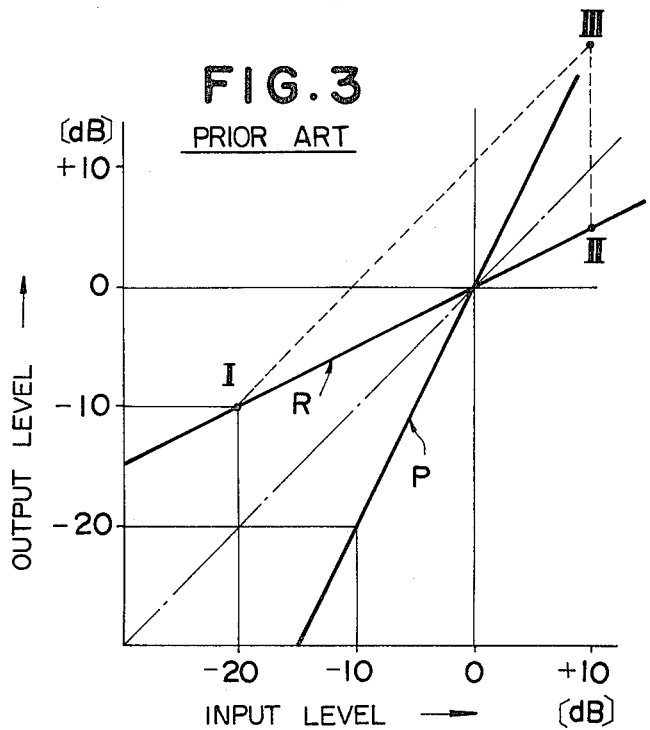
FIG. 3 is a graphical diagram illustrating the compression and expansion characteristics of the gain control circuit of FIG. 1.

It should therefore be appreciated that input signal x and output signal y are in logarithmic-linear relation, as illustrated by curve R in FIG. 3 with output signal y being compressed in relation to input signal x and with the compression ratio being dependent on the gain A of amplifier 9c. For example, if A=1 and log y=½ log x, so then, as shown in FIG. 3, when input signal x has a level of −20 dB, output signal y is compressed to a level of −10 dB. The compressed signal from compression signal circuit 7 is then fed to a recording and reproducing device 1 through an output terminal 5 of encoder circuit 2. Device 1 may be of conventional design such as an audio signal tape recording and reproducing apparatus, and is effective to record on magnetic tape or other recording medium the encoded signal received at terminal 5.

Referring back to FIG. 1, it is seen that, in the information signal recording and reproducing apparatus according to the prior art as there illustrated, a reproducing section includes an output gain control or decoder circuit 3 having an input terminal 11 supplied with the encoded signal reproduced from the recording medium. Decoder circuit 3 transforms the reproduced encoded signal into the original information signal supplied to input terminal 4 of encoder circuit 2 and, for that purpose, acts on the signal supplied thereto in a manner substantially complementary to encoder circuit 2. Decoder circuit 2 includes an expansion circuit 13 for expanding the reproduced information signal in a manner substantially complementary to the amount of compression from compression circuit 7. Thus, as shown in FIG. 3 by curve P, the input-output level characteristic of expansion circuit 13 is a mirror image of curve R of compression circuit 7. For example, when the level of the information signal supplied to compression circuit 7 is −20 dB, compression circuit 7 produces an output signal having a level of −10 dB. When this output signal having a level of −10 dB is applied to expansion circuit 13, the information signal is returned to its original level of −20 dB, as shown by the thin solid lines in FIG. 3. The output of expansion circuit 13 is supplied to a de-emphasis circuit 14 also included in decoder circuit 3 for attenuating the high frequency components of the reproduced encoded signal in a manner substantially complementary to the amount of pre-emphasis from pre-emphasis circuit 6, as shown by curve DE in FIG. 2. It should be realized, however, that the positional arrangement of expansion circuit 13 and de-emphasis circuit 14 may be reversed with no change in the effect on the reproduced encoded signal. The resulting reproduced signal is supplied to an output terminal 12 of decoder circuit 3.

As shown in FIG. 1, expansion circuit 13 includes a variable gain amplifier 15 supplied with the reproduced encoded signal from input terminal 11 and which is similar to variable gain amplifier 8 of compression circuit 7. A level detecting circuit 16 is also supplied with the encoded signal and produces a control voltage in response thereto which is supplied to variable gain amplifier 15 so as to regulate the gain thereof.

Figure 5:
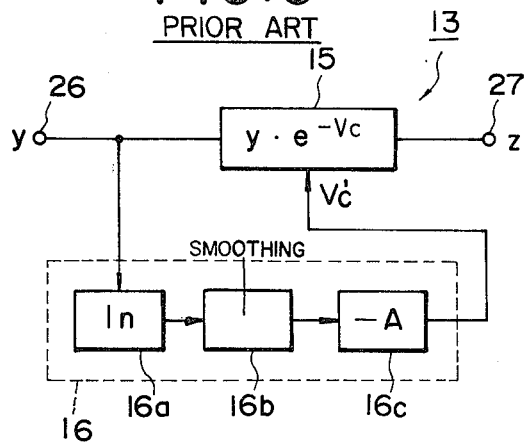
FIG. 5 is a block diagram of a known expansion circuit that may be used in the gain control circuit of FIG. 1.

Referring now to FIG. 5, there is shown one embodiment of an expansion circuit 13 commonly used with decoder circuit 3 of FIG. 1. As shown therein, variable gain amplifier 15 is supplied at an input terminal 26 thereof with encoded information signal y and produces an output signal z at an output terminal 27 in response thereto which can be represented as follows:

$$z = y \cdot e^{-V_c'} \qquad (5)$$

where $V_c'$ is the control voltage supplied to amplifier 15 by level detecting circuit 16. This latter circuit includes a natural logarithmically converting circuit 16a supplied with encoded information signal y and which, in turn, produces an output which is supplied through a smoothing circuit 16b to an amplifier 16c having a gain of −A. Amplifier 16c produces control voltage $V_c'$ which is represented as follows:

$$V_c' = -A \cdot \ln y \qquad (6)$$

Equations (5) and (6) can be combined to form a simplified expression for output signal z as follows:

$$z = y \cdot e^{A \cdot \ln y} = y \cdot e^{\ln y^A} = y \cdot y^A$$
$$z = y^{1+A} \qquad (7)$$

Equation (7) can be transformed into its logarithmic or decibel equivalent and rewritten as follows:

$$\log z = (1+A) \log y \qquad (8)$$

Upon comparing equations (4) and (8), it should be appreciated that the slopes of the logarithmic input-output characteristics thereof are in reciprocal relation. For example, when A=1, the slope of the logarithmic input-output curve for compression circuit 7 is ½ while the slope of the logarithmic input-output curve of expression circuit 13 is 2.

It should further be appreciated that decoder circuit 3 reproduces exactly, at output terminal 12 thereof, the original information signal supplied to input terminal 4 of encoder circuit 2. More particularly, if equation (3) is substituted into equation (7), it is seen that:

$$z = \left( x^{\frac{1}{1+A}} \right)^{(1+A)} = x. \qquad (9)$$

However, the above compression circuit 7 of FIG. 4 and expansion circuit of FIG. 5 pose various problems. For example, the compression and expansion circuits of FIGS. 4 and 5 exhibit a poor transient characteristic for changes in signal level. In particular, these circuits fail to adequately respond when the signal level is abruptly increased from a first low level to a second higher level. For example, when the level of an input signal is abruptly increased, as shown in FIG. 6A, an output signal y, as shown in FIG. 6B, is produced at output 22 of compression circuit 7 of FIG. 4. Thus, when the input signal level is increased, as shown by the positive-going edge in FIG. 6A, the resulting output signal has a corresponding overshoot portion which is substantially greater than the desired level of the output signal. The time within which this overshoot falls back to its desired level is termed the attack time $t_A$. However, it becomes difficult to choose a correct attack time $t_A$ since an attack time which is too long will distort the sound which is eventually reproduced and an attack time that is too short will result in a clicking noise in the reproduced sound. An optimum attack time $t_A$ is therefore set in the range of 100 μs to 10 ms. In like manner, when the input signal level falls from a high value to a low value as shown by the negative-going edge of the signal in FIG. 6A, a negative overshoot occurs and the time within which the level of the signal returns from the overshoot level to its desired level is termed the recovery time $t_R$. As shown in FIG. 6B, the recovery time $t_R$ is optimally set for a comparatively long time which is generally greater than 100 ms. It should be appreciated that the attack time $t_A$ and the recovery time $t_R$ result from the charging and discharging of a capacitor in the circuit. However, the setting of these response times $t_A$ and $t_r$ becomes difficult.

Further, overshoots as a result of increasing signal levels within the relatively short attack time $t_A$ may, for example, have a level which is 10 dB greater than the desired signal level. Such increase in signal level is, of course, undesirable and results in the occurrence of a distorted sound when reproduced from a magnetic tape. This distortion results because the magnetic tape is only designed to record, without distortion, signals up to a certain level. Above this level, the magnetic tape becomes saturated so that recording of signals above this level results in distortion of the reproduced sound.

Referring back to FIG. 3, it is seen that if an input signal level changes from −20 dB to +10 dM, the output signal level changes from a point I on the solid line curve R of FIG. 3 to a point II thereon. However, because the gain of variable gain amplifier 8 cannot instantaneously follow the above-described rapid signal level increase, the output signal level is first raised from point I to a point III, as represented by the broken line in FIG. 7. This results in the high level input signal being acted on for a short interval with a large gain from variable gain amplifier 8. Thereafter, the output signal level is slowly lowered from point III to point II within the attack time $t_A$ as the gain of amplifier 8 slowly decreases.

In order to remedy the above problem, it has been proposed that a limiter circuit be included at the output of variable gain amplifier 8 for suppressing such overshoots. However, this has also proven to be undesirable since the limiter circuit limits the output from variable gain amplifier 8 to a predetermined level, resulting in a signal having a distorted waveform.

Referring now to FIG. 7, there is shown one embodiment of a compression circuit 30 for a gain control circuit according to this invention. In this embodiment, the information signal is supplied to a pre-emphasis circuit 6 (FIG. 1) for pre-emphasizing the high frequency components of the signal, and the pre-emphasized signal is then supplied to an input terminal 31 of compression circuit 30 (FIG. 7). Compression circuit 30 includes a first transmission path including a first variable gain amplifier 33, such as a voltage controlled amplifier, having its input connected to input terminal 31 through a resistor 35 and its output connected to the inverting input of an operational amplifier 37 through a resistor 36. The signal from input terminal 31 is also supplied to a second transmission path, including a second variable gain amplifier 34 having its input connected to input terminal 31 through a resistor 38 and its output also connected to the inverting input of amplifier 37 through a resistor 39.

A control circuit 40 is also included in compression circuit 30 for supplying respective control signals to variable gain amplifiers 33 and 34 for varying the gains thereof. In particular, control circuit 40 includes a level detecting circuit 42 which detects either the information signal from input terminal 31 or the combined output signals from variable gain amplifiers 33 and 34, these signals being supplied to an input terminal 41 of level detecting circuit 42 which, in turn, produces a detected output signal in response to the detection of such signals. The detected output signal from level detecting circuit 42 is supplied to a non-linear circuit 45 having a first non-linear circuit portion 43 which produces a control voltage $V_{c1}$ for variable gain amplifier 33 in response to the detected output signal from level detecting circuit 42 and a second non-linear circuit portion 44 which produces a control voltage $V_{c2}$ for variable gain amplifier 34 in response to the detected output signal from level detecting circuit 42.

Figure 8:
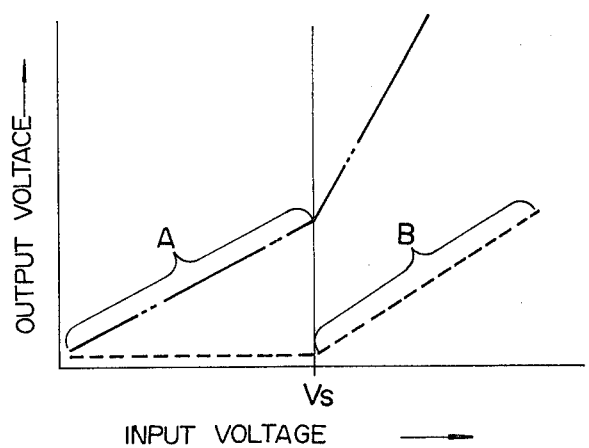
FIG. 8 is a graphical diagram illustrating the input-output level characteristics of a non-linear circuit of the compression circuit of FIG. 7.

Non-linear circuit portion 43 has an input-output characteristic which, as shown by the dot-dash curve on FIG. 8, has a first linear slope when the detected output signal from level detecting circuit 42 is less than a predetermined voltage $V_S$ and a second linear slope which is greater than the first linear slope when the level of the detected output signal is greater than the predetermined voltage $V_S$. In other words, the input-output characteristic of non-linear circuit portion 43 is of a "bent-linear" nature. In like manner, non-linear circuit portion 44 has an input-output characteristic which, as shown by the dotted line on FIG. 8, has a first linear slope when the detected output signal from level detecting circuit 42 is less than the predetermined voltage $V_S$ and a second linear slope which is greater than the first linear slope when the level of the detected output signal is greater than the predetermined voltage $V_S$.

Figure 9:
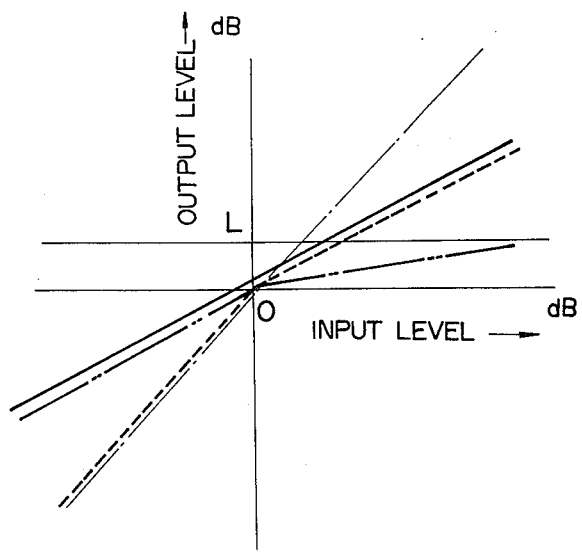
FIG. 9 is a graphical diagram illustrating the input-output level characteristic of the compression circuit of FIG. 7.

Therefore, if the input-output level characteristics of variable gain amplifiers 33 and 34 are plotted, respective "bent-linear" curves will also be exhibited, as shown by the dot-dash thick line and dotted line of FIG. 9, respectively. In this regard, the 0 dB reference level at which the dotted line and dot-dash line curves of FIG. 9 are bent, corresponds to the predetermined voltage $V_S$ of FIG. 8. As a result, the gradient of the input-output level curve of variable gain amplifier 33 for input levels less than 0 dB has a first value, for example, a slope of ½ whereby a compression ratio of 2:1 is produced by variable gain amplifier 33. However, for input levels greater than 0 dB, the gradient of the input-output level curve for variable gain amplifier 33 is less than the aforementioned gradient so that a compression ratio of n:1 is produced where n is greater than 2. In like manner, the gradient of the input-output level curve of variable gain amplifier 34 for input levels less than 0 dB has a first value, for example, a slope of 1 whereby the input signal is transmitted with substantially unity gain. However, for input levels greater than 0 dB, the gradient of the input-output level curve is less than the aforementioned gradient so that a compression ratio of m:1 is produced where m is greater than 1. For example, in FIG. 9, m=2. Thus, the compressed information signal from the first transmission path of variable gain amplifier 33 and the compressed information signal from variable gain amplifier 34 of the second transmission path are both supplied to an input, preferably the inverting input, of operational amplifier 42 where they are added. As can readily be seen from the dotted line and dot-dash thick line characteristics of FIG. 9, when the level of the input information signal is less than the 0 dB reference level, the compressed information signal from variable gain amplifier 33 of the first transmission path is much greater than the compressed information signal from variable gain amplifier 34 of the second transmission path so that the compressed signal from variable gain amplifier 33 is effectively produced at the output terminal 32 of amplifier 37. In comparison, when the level of the input information signal is greater than the 0 dB reference level, the compressed information signal from variable gain amplifier 34 of the second transmission path is much greater than the compressed signal from variable gain amplifier 33 so that the compressed signal from the second transmission path is effectively produced at output terminal 32 of amplifier 37. In other words, the compressed signal from the second transmission path of variable gain amplifier 34 can effectively be ignored when the level of the information signal is less than the 0 dB reference level and the compressed signal from variable gain amplifier 33 can effectively be ignored when the level of the information signal is greater than the 0 dB reference level. Accordingly, amplifier 37 adds the compressed signals at such time to produce an effective composite input-output characteristic shown by the solid line in FIG. 9. It should be realized that this characteristic is substantially identical to the prior art characteristic shown by curve R in FIG. 3. Further, as shown on FIG. 7, a feedback resistor is connected between the output of amplifier 37 and the inverting input thereof for stabilizing the gain of amplifier 37.

It should be appreciated that the control voltages supplied by first and second non-linear circuit portions 43 and 44 of non-linear circuit 45 result in compression circuit 30 having a logarithmic linear input-output characteristic shown by the solid line curve of FIG. 9. In order to achieve this result, the linear characteristic of non-linear circuit portion 43 for input levels less than the predetermined voltage $V_S$, represented by portion A of the dot-dash curve on FIG. 8, should have the same slope as the linear characteristic of non-linear circuit portion 44 for input levels greater than the predetermined voltage $V_S$, represented by portion B of the dotted curves on FIG. 8.

Figure 10:
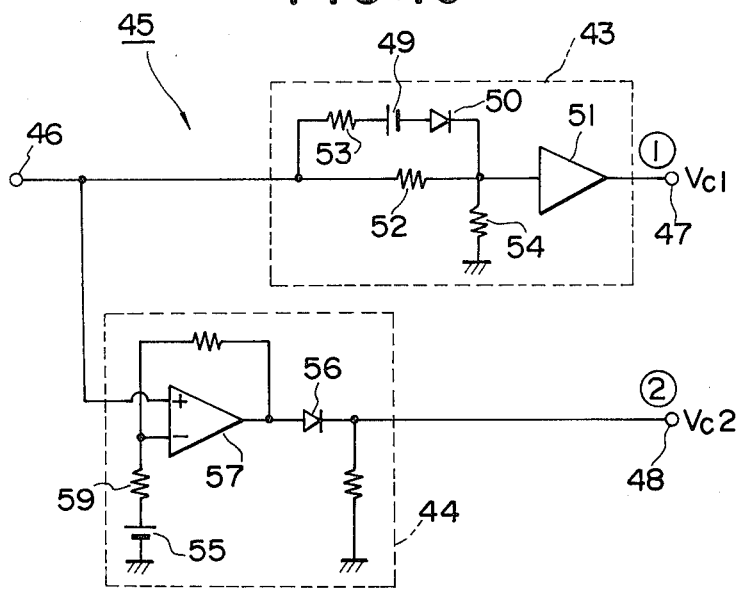
FIG. 10 is a circuit wiring diagram of a non-linear circuit that can be used in the compression circuit of FIG. 7.

Referring now to FIG. 10, there is shown one circuit arrangement that may be used for non-linear circuit 45 in the gain control circuit according to the present invention. As shown therein, the detected output signal from level detecting circuit 42 is supplied through an input terminal 46 and a resistor 52 to a first amplifier 51 of non-linear circuit portion 43. A series circuit comprised of a resistor 53, a voltage source 49 for producing a voltage substantially equal to the predetermined voltage $V_S$ (FIG. 8) and having its positive terminal connected to resistor 53, and a diode 50 having its anode connected to the negative terminal of voltage source 49, is connected in parallel with resistor 52 between input terminal 46 and the input of amplifier 51. Further, the input of amplifier 51 is connected to ground through a resistor 54, and the output of amplifier 51 is connected to a terminal 47 which is, in turn, connected to the control input of variable gain amplifier 33. Thus, when the level of the information signal supplied to input terminal 46 is less than the predetermined voltage $V_S$, diode 50 is rendered inoperative or turned OFF so that a first voltage divider comprised of resistors 52 and 54 supplies a voltage divided signal to amplifier 51. Therefore, at this time, non-linear circuit portion 43 has a first gain characteristic. However, when the level of the information signal supplied to input terminal 46 is greater than the predetermined voltage $V_S$, diode 50 is turned ON. This results in resistors 52 and 53, which are in parallel, forming an equivalent resistance in a voltage divider circuit with resistor 54 so that non-linear portion 43 has a second gain characteristic. Accordingly, the voltage-dividing ratio acting on the signal supplied to amplifier 51 changes so that the bent-linear input-output characteristic represented by the dot-dash line on FIG. 8 is obtained. The output signal obtained from amplifier 51 at output terminal 47 thereof constitutes a first control voltage $V_{c1}$ which is supplied to variable gain amplifier 33 for varying the gain thereof.

The signal at input terminal 46 is also supplied to non-linear circuit portion 44. In particular, this signal is supplied to the non-inverting input of an operational amplifier 57. The inverting input of amplifier 57 is connected to ground through a resistor 59 and voltage source 55. The output of operational amplifier 57 is connected to the inverting input thereof through a feedback resistor for stabilizing the gain thereof, and is also connected to the anode of a diode 56 having its cathode connected to ground through a resistor. The output from diode 56 is supplied to an output terminal 48 and constitutes a second control voltage $V_{c2}$ for varying the gain of variable gain amplifier 34. It should be appreciated that voltage source 55 produces a voltage substantially equal to the predetermined voltage $V_S$ so that when an input signal supplied to input terminal 46 is lower than the predetermined voltage $V_S$, the output from amplifier 57 has a negative value and diode 56 is rendered inoperative or turned OFF. Since variable gain amplifier 34 is substantially identical to variable gain amplifier 8 of FIG. 4, variable gain amplifier 34 transmits the signal from input terminal 31 with substantially unity gain. However, when the input signal supplied to input terminal 46 has a value greater than the predetermined voltage $V_S$, the output from amplifier 57 has a positive value for turning ON diode 56 whereby the control voltage $V_{c2}$ is increased in proportion to increases in the input signal level at input terminal 46 so that non-linear circuit portion 44 has a second gain characteristic. Accordingly, an input-output level characteristic represented by the dotted line in FIG. 8 is produced by non-linear circuit portion 44. It should be appreciated that the gains of amplifiers 51 and 57 are adjusted so that the first gain of amplifier 51, when the input signal level at terminal 46 is lower than the predetermined voltage $V_S$, is equal to the second gain of amplifier 57, when the level of the input signal level at input terminal 46 is greater than the predetermined voltage $V_S$. This results in the input-output characteristics of non-linear circuit portions 43 and 44, represented by portions A and B of the curves in FIG. 8, having the same slope.

Figure 11:
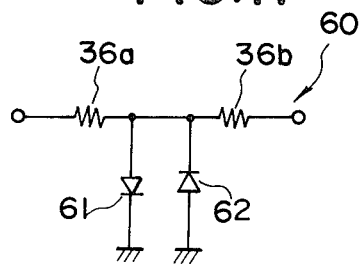
FIG. 11 is a circuit wiring diagram of a limiter circuit that may be used in the compression circuit of FIG. 7.

The compression circuit of FIG. 7 further preferably has a limiter circuit at the output of variable gain amplifier 33 for providing positive and negative limiting levels L therefor. For example, as shown in FIG. 11, resistor 36 is separated into two resistors 36a and 36b, and a diode limiter circuit 60 is provided which is comprised of two diodes 61 and 62 connected between the output of resistor 36a and ground arranged in opposing relation to the other. In other words, as shown in FIG. 11, the cathode of diode 62 and the anode of diode 61 are connected to the output of resistor 36a and the anode of diode 62 and the cathode of diode 61 are connected to ground. It should therefore be appreciated that, for output levels of variable gain amplifier 33 greater than the positive limiting level L (FIG. 9) of limiting circuit 60, diode 61 is turned ON so as to connect to the output thereof to ground. In like manner, it will be realized that diode 62 acts to produce a negative limiting level for the output of variable gain amplifier 33.

It should be appreciated that the use of such first and second transmission paths substantially eliminates the problems inherent in the prior art apparatus previously discussed. As previously noted, with the prior art compression circuit of FIG. 4, the gain of variable gain amplifier 8 cannot change instantaneously with changes in the signal level, so that an abrupt increase in the signal level results in overshoots which have a deleterious effect on the sounds reproduced from such signal when recorded on a magnetic tape. However, the gain control circuit according to this invention, as shown in FIGS. 7 and 10, substantially eliminates such adverse effects. More particularly, when the level of the input signal changes from a low value, for example, below 0 dB to a higher value above the 0 dB reference level, variable gain amplifier 33 produces an output signal with overshoots. However, since limiter circuit 60 is positioned outside of variable gain amplifier 33, the overshoots are effectively suppressed. In other words, when large overshoots from variable gain amplifier 33 are supplied to limiter circuit 60, diode 61 turns ON so as to ground such overshoots. However, when the input level is greater than 0 dB, adder amplifier 37 is effectively supplied with the compressed information signal from the second transmission path of variable gain amplifier 34. As a result, any distortion in the signals is substantially eliminated.

Figure 12:
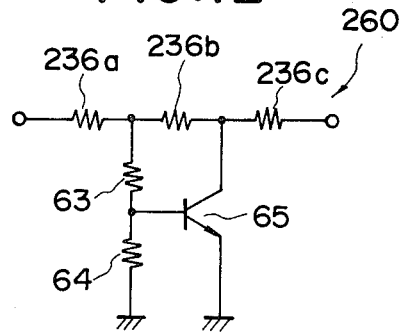
FIG. 12 is a circuit wiring diagram of another limiter circuit that may be used in the compression circuit of FIG. 7.

Although the limiter circuit used in the embodiment of FIG. 11 is a diode limiter circuit 60, it should be appreciated that any equivalent limiter circuit may be substituted therefor. For example, as shown in FIG. 12, a transistor limiter circuit 260 may be used. In this circuit, three resistors 236a, 236b and 236c are connected in series between an input terminal and output terminal of limiter circuit 260 and two resistors 63 and 64 are connected in series between a junction point of resistors 236a and 236b and ground. An NPN transistor 65 has its base connected to ground through resistor 64, its emitter connected directly to ground and its collector connected to a junction point between resistors 236b and 236c. Thus, when the level of the information signal supplied from variable gain amplifier 33 of FIG. 7 to the input terminal of limiter circuit 260 is less than a predetermined voltage, the voltage supplies to the base of transistor 65 is insufficient to turn ON the transistor. Accordingly, at such time, the compressed information signal from variable gain amplifier 33 is supplied through resistors 236a, 236b and 236c to the inverting input of operational amplifier 37. However, when the level of the compressed information signal is greater than such predetermined voltage, transistor 65 is turned ON so that the compressed information signal is grounded through the collector-emitter path of transistor 65.

Limiter circuits 60 and 260 have a relatively flat frequency characteristic, that is, a characteristic which is substantially dependent only upon the level of the signal supplied thereto and not on the frequency of the signal. However, conventional magnetic tape used in audio signal recording and reproducing apparatus has a frequency characteristic which decreases the maximum signal level which can be reproduced from the magnetic tape at higher frequencies as a result of the saturation characteristic thereof. Since limiter circuits 60 and 260 have a flat frequency characteristic, that is, are not frequency dependent, the limiting levels thereof are set in conformance with the maximum output level which can be reproduced from the magnetic tape for high frequency signals. The signal levels of low and mid-frequency signals are thereby limited to a greater extent than necessary. If a compromise is sought between excessive limitation in the low and midfrequency ranges and decreased limiting level for the high frequency range, the low and mid-frequency signals will still have their signal levels limited to an extent greater than necessary while signal levels in the high frequency range will not be sufficiently limited so that some saturation in this latter range will occur. Accordingly, it is desirable to have a limiter circuit which is frequency dependent in a complementary manner to the frequency characteristic of the magnetic tape utilized.

Figure 13:
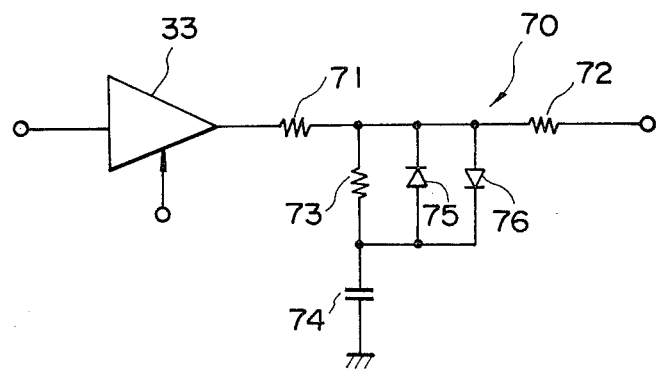
FIG. 13 is a circuit wiring diagram of still another limiter circuit having a frequency dependency and which can be used in the compression circuit of FIG. 7.
Figure 14:
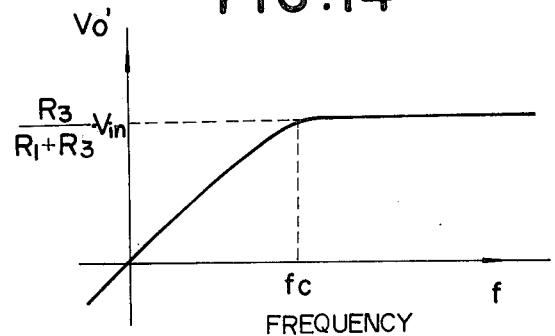
FIG. 14 is a graphical diagram illustrating the frequency characteristic of the limiter circuit of FIG. 13.

Referring now to FIG. 13, there is shown one embodiment of a limiter circuit 70 which can be substituted for limiter circuit 60 of FIG. 11 and which has a frequency characteristic corresponding to the saturation characteristic of a magnetic tape. As shown therein, resistors 71 and 72 are connected in series between the output of variable gain amplifier 33 and the output of limiting circuit 70 which, in turn, is connected to the inverting input of operational amplifier 37 (FIG. 7). A series circuit of a resistor 73 and a capacitor 74 is connected between a junction point of resistors 71 and 72 and ground. Two diodes 75 and 76 are each connected in parallel with resistor 73 and are arranged to opposing relation. In particular, the cathode of diode 75 and the anode of diode 76 are connected to the junction point between resistors 71 and 72 and the anode of diode 75 and the cathode of diode 76 are connected in common to the junction point between resistor 73 and capacitor 74. If the resistance values of resistors 71 and 73 are $R_1$ and $R_3$, respectively, and the capacitance value of capacitor 74 is C, a voltage $V_o$ applied across resistor 73 and, of course, across each of diodes 75 and 76, can be expressed as follows:

$$V_o = \frac{R_3}{R_1 + R_3 + \frac{1}{j\omega C}} \cdot V_{in} \quad (10)$$

$$= \frac{j\omega C R_3}{1 + j\omega C(R_1 + R_3)} \cdot V_{in},$$

where $V_{in}$ is the voltage supplied to limiter circuit 70 from variable gain amplifier 33. It should therefore be appreciated that, at high frequencies, capacitor 74 is effectively shorted in the circuit so that diodes 75 and 76 operate in a substantially identical manner to limiter circuit 60 of FIG. 11. In other words, and as shown in FIG. 14, a substantially flat frequency response is generated for high frequency signals above the frequency $f_c$, with the maximum value of the output signal from limiter circuit 70 is equal to $$\frac{R_3}{R_1 + R_3} \cdot V_{in}.$$

This latter value is, of course, equal to the cut-in voltage of either of diodes 75 and 76 depending on the polarity of input voltage $V_{in}$. In comparison, at low frequencies, capacitor 74 retains a charge whereby the junction point between resistor 73 and a capacitor 74 is raised to a voltage greater than ground potential. This means that a higher level of input voltage $V_{in}$ is required to turn ON diode 76 so that the maximum output level from limiter circuit 70 which can be recorded on the magnetic tape is increased for low frequency signals. In a practical embodiment of the arrangement of FIG. 13, the frequency characteristic of the voltage developed across resistor 73, and consequently, across diodes 75 and 76, provides a substantially flat characteristic for high frequencies, whereas, at low frequencies below cut-off frequency $f_C$, where:

$$f_C = \frac{1}{2\pi C(R_1 + R_3)}, \quad (11)$$

the voltage $V_o$ developed across resistor 73 falls at a rate of 6 dB/octave. It should be realized, however, that a predetermined limiting level may be provided for the low frequency signals which is different than that for the high frequency signals by merely connecting a resistor in parallel with capacitor 74.

Figure 15:
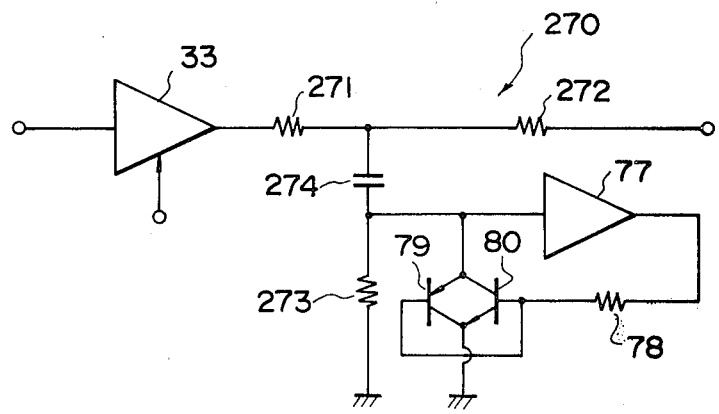
FIG. 15 is a circuit wiring diagram of yet another limiter circuit having a frequency dependency and which can be used in the compression circuit of FIG. 7.

Referring now to FIG. 15, there is shown another embodiment of a frequency dependent limiter circuit 270 which can be substituted for limiter circuit 60 (FIG. 11) and which has a frequency characteristic identical to limiter circuit 70 of FIG. 13. As shown therein, resistors 271 and 272 are connected in series between the output of variable gain amplifier 33 and the output of limiter circuit 270. A capacitor 274 and a resistor 273 are connected in series between the junction of resistors 271 and 272 and ground, and a pair of transistors 279 and 280 each have their collector-emitter paths connected in parallel with resistor 273. In particular, transistor 79 is a PNP transistor and transistor 80 is an NPN transistor, and the emitter of transistor 79 and the collector of transistor 80 are commonly connected to a junction point between capacitor 274 and resistor 273 and the collector of transistor 79 and the emitter of transistor 80 are connected in common to ground. Further, an amplifier 77 has its input connected to the junction point between capacitor 274 and resistor 273 and its output connected through a resistor 78 to the commonly connected bases of transistors 79 and 80. It should be appreciated that this circuit operates in a substantially identical manner to limiter circuit 70 of FIG. 13. In particular, at high frequencies, capacitor 274 is effectively shorted so that the signal from variable gain amplifier 33 is supplied across resistor 273 for turning ON one of transistors 79 and 80, depending on the polarity of the signal across resistor 273. When either of transistors 79 or 80 is turned ON, the output signal from variable gain amplifier 33 is grounded through the collector-emitter path of such transistor. However, at low frequencies, the level of the signal from variable gain amplifier 33 must be higher in order to supply the same operating voltage across resistor 273, due to the charging of capacitor 274. Accordingly, the maximum level of the input signal which is recorded on the magnetic tape is higher for low and mid-frequency signals than for high frequency signals.

Figure 16:
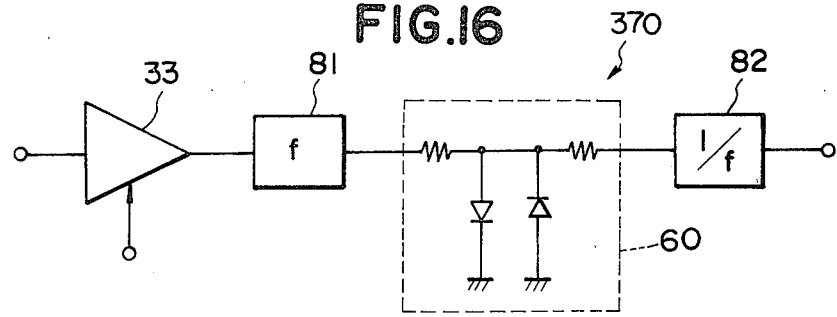
FIG. 16 is a block-circuit wiring diagram of a further limiter circuit having a frequency dependency and which can be used in the compression circuit of FIG. 7.

A further embodiment of a frequency dependent limiter circuit 370 is shown in FIG. 16. Limiter circuit 370 is comprised of a sub-limiter circuit 60 identical to the limiter circuit of FIG. 11 and which has a substantially flat frequency characteristic. A first filter circuit 81 is interposed between variable gain amplifier 33 and the input of sub-limiter circuit 60 and has a frequency characteristic $f(\omega)$ and a second filter circuit 82 is supplied with the output from sub-limiter circuit 60 and has a frequency characteristic $1/f(\omega)$ which is the reciprocal or inverse of the frequency characteristic of filter circuit 81. In this manner, filter circuits 81 and 82 are designed to have a desired frequency characteristic which, in conjunction with sub-limiter circuit 60 of FIG. 17, provide an effective frequency dependent limiter circuit 370.

Figure 17:
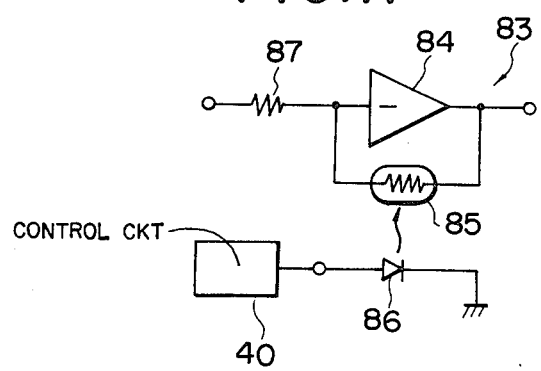
FIG. 17 is a block-circuit wiring diagram of a variable gain amplifier that can be used with the compression circuit of FIG. 7.
Figure 18:
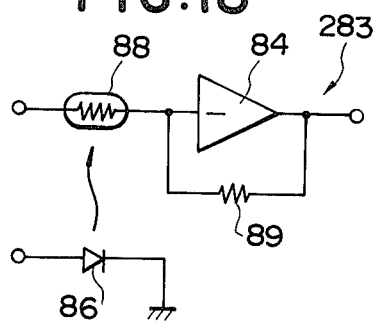
FIG. 18 is a block-circuit wiring diagram of another variable gain amplifier than can be used with the compression circuit of FIG. 7.

Referring now to FIG. 17, there is shown one embodiment of a variable gain amplifier 83 that can be used for the amplifier 33 and for the amplifier 34 of the compression circuit of FIG. 7. As shown therein, variable gain amplifier 83 includes an operational amplifier 84 having the pre-emphasized signal from pre-emphasis circuit 6 (FIG. 1) supplied to its inverting input through a resistor 87. A negative feedback resistor 85, such as a CdS photoconductive cell, is connected between the output and inverting input of operational amplifier 84, and a light emitting element 86, such as a light emitting diode, emits light in accordance with the control voltage from the respective circuit portion 43 or 44 of control circuit 40 for irradiating negative feedback resistor 85. It is to be appreciated that the gain of variable gain amplifier 83 is determined by the resistance value of resistor 87 and the resistance value of negative feedback resistor 85. In this manner, depending on the level of the control signal from control circuit 40, the resistance value of negative feedback resistor 85 is varied so as to vary the gain of operational amplifier 84 and variable gain amplifier 83. It should be appreciated that since the gain of variable gain amplifier 83 is determined by the resistance values of resistor 87 and negative feedback resistor 85, that the positional arrangement of these two resistors may be switched. Thus, as shown in FIG. 18, a resistor 89 having a fixed resistance value is connected between the input and output terminals of operational amplifier 84 and a negative feedback resistor 88, such as a CdS photoconductive cell, is positioned at the inverting input of operational amplifier 84 so as to form a variable gain amplifier 283.

It should be appreciated that gain control circuit 30 of FIG. 7 can be utilized as a compression circuit or an expansion circuit. When gain control circuit 30 is used as a compression circuit, control circuit 40 and, more particularly, level detecting circuit 42 thereof detects the level of the compressed signals from variable gain amplifiers 33 and 34. However, when gain control circuit 30 is used as an expansion circuit, level detecting circuit 42 detects the level of the input signal supplied to input terminal 31. It should be appreciated that such compression and expansion operations have a reciprocal or inverse relation.

Figure 20:
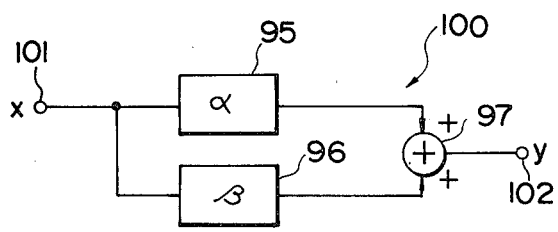
FIG. 20 is a block diagram to which reference will be made in explaining the operation of the compression circuit of FIG. 7.
Figure 21:
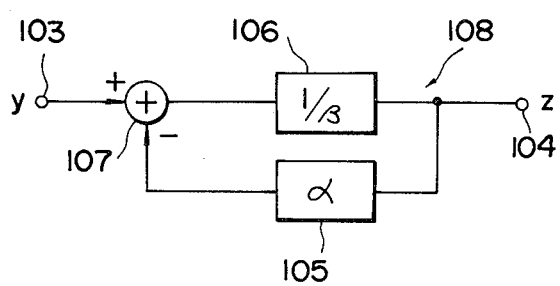
FIG. 21 is a block diagram to which reference will be made in explaining the operation of an expansion circuit which is complemental to the compression circuit of FIG. 7.

Referring now to FIGS. 20 and 21, the principle of operation of gain control circuit 30 will now be discussed. Referring first to FIG. 20 which illustrates an encoder or input gain control circuit 100 according to this invention and which is representative, for example, of compression circuit 30 of FIG. 7, an input information signal x is supplied to an input terminal 101 of encoder circuit 100. This signal is then supplied through a first transmission path 96 which acts on the signal with a transmission function $\beta$ and through a second transmission path 95 which acts on the signal with a transmission function $\alpha$. The signals transmitted through the two transmission paths 95 and 96 are added in an adding circuit 97 and this added signal is supplied as an output signal y to an output terminal 102 of encoder circuit 100, where output signal y can be represented as follows:

$$y = (\alpha + \beta)x \qquad (12).$$

A decoder or output gain control circuit 108 according to this invention is shown in FIG. 21. In particular, a reproduced signal which corresponds to encoded signal y from output terminal 102 of encoder circuit 100 is supplied to an input terminal 103 of decoder circuit 108. This signal is then supplied to a positive input terminal of an adding circuit 107. The output signal from adding circuit 197 is transmitted to an output terminal 104 of decoder circuit 108 through a first transmission path 106 having a transmission function $1/\beta$ which is the reciprocal of the function of first transmission path 96 of encoder circuit 100. This results in an output signal z being supplied to output terminal 104 of decoder circuit 106 and also to a negative input terminal of adding circuit 107 through a second transmission path 105 having a transmission function $\alpha$. Accordingly, the output signal z produced at output terminal 104 which can be represented as follows:

$$z = 1/\beta(y - \alpha z) \qquad (13).$$

Equation (12) may be substituted in equation (13), as follows:

$$\beta z = (\alpha + \beta)x - \alpha z$$

$$(\alpha + \beta)z = (\alpha + \beta)x$$

$$z = x \qquad (14).$$

In other words, the information signal which had previously been subjected to compression in encoder circuit 100 is returned to its original form by decoder circuit 108 which provides a complementary expansion to the encoded signal.

Figure 19:
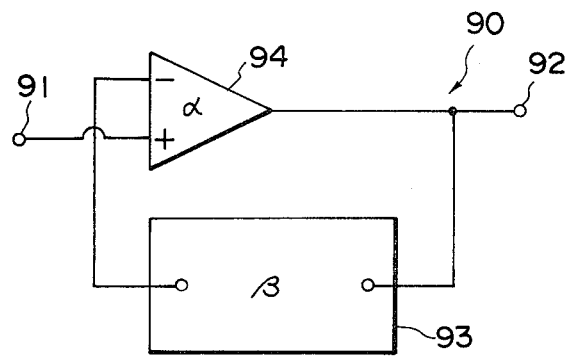
FIG. 19 is a block diagram to which reference will be made in explaining the operation of a complemental expansion circuit by using many of the components of the compression circuit of FIG. 7.

It should be appreciated that the inverse or reciprocal transmission function $1/\beta$ of transmission path 106 (FIG. 21) can be obtained substantially by utilizing the circuitry of encoder circuit 100 (FIG. 20). For example, as shown in FIG. 19, a negative feedback circuit 90 includes an operational amplifier 94 having the encoded signal y supplied to its non-inverting input. The output from operational amplifier 94 is fed back to the inverting input thereof in a negative feedback loop through a transmission path 93 having a transmission function $\beta$, where transmission path 93 is equivalent to transmission path 96 of FIG. 20. If the gain of operational amplifier 94 is $\alpha$, the transmission function G of negative feedback circuit 90 can be represented as follows:

$$G = \frac{\alpha}{1 + \alpha\beta}. \qquad (15)$$

If the values of $\alpha$ and $\beta$ are chosen so that $\alpha\beta >> 1$, then transmission function G can be represented as follows:

$$G = (1/\beta) \qquad (16).$$

In this manner, the reciprocal or inverse transfer function $1/\beta$ for transmission path 106 of FIG. 21 is obtained by utilizing circuitry similar to that of encoder circuit 100.

Figure 22:
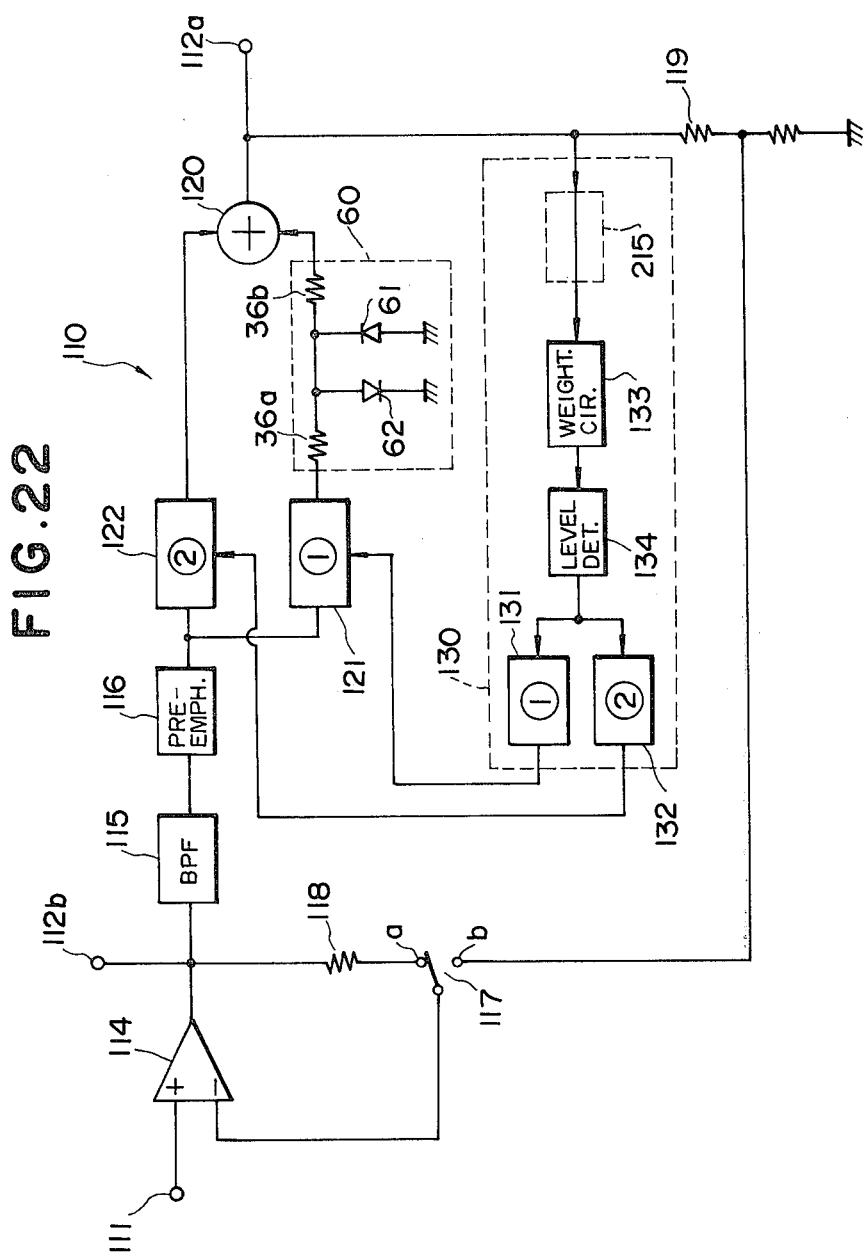
FIG. 22 is a block-circuit wiring diagram of another embodiment of a gain control circuit according to the present invention.
Figure 23:
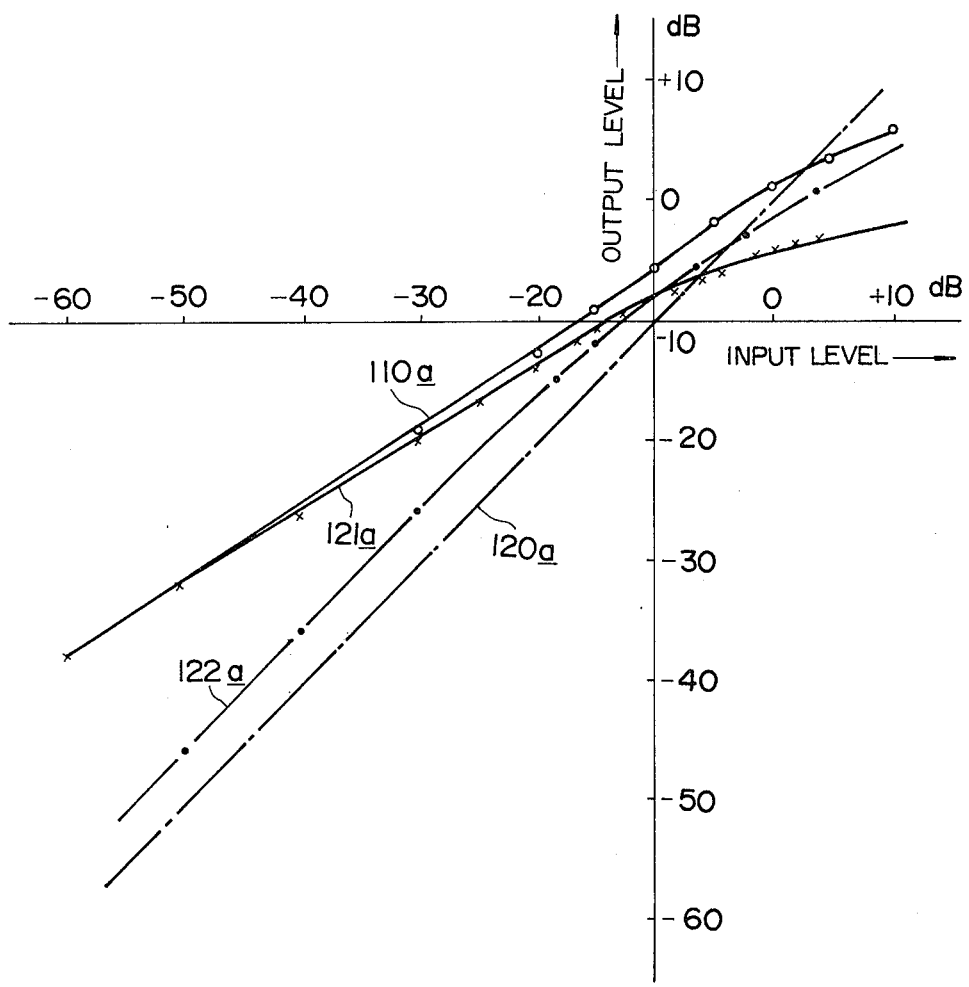
FIG. 23 is a graphical diagram illustrating the input-output level characteristic of the gain control circuit of FIG. 22.

Referring now to FIG. 22, there is shown another embodiment of a gain control circuit according to the present invention which can be utilized as an encoder of input gain control circuit or a decoder or output gain control circuit. More particularly, an information signal, such as an audio signal, is supplied through an input terminal 111 of gain control circuit 110 to the noninverting input of an operational amplifier 114, and the output from amplifier 114 is adapted to be applied to the inverting input thereof through a resistor 118 and a switching device, shown as a single pole, double throw switch 117 and, more particularly, through a fixed terminal a and a movable tap of such switch 117. It should, however, be realized that switch 117 is preferably constituted by a semiconductor gating device. The output from operational amplifier 114 is further supplied through a band-pass filter 115 to a pre-emphasis circuit 116 formed, for example, by a high pass filter for reducing noise modulation. Although filter 115 is shown to be positioned at the output side of operational amplifier 114, it may be positioned at the input side of operational amplifier 114 with no change in its affect on the input information signal. Pre-emphasis circuit 116 supplies a pre-emphasized signal to variable gain amplifiers 121 and 122 which correspond to variable gain amplifiers 33 and 34 of FIG. 7, respectively, and which compress the signals supplied thereto in a manner similar to such amplifiers 33 and 34. In other words, as shown in FIG. 23, variable gain amplifier 121 exhibits a substantially bent-linear input-output characteristic as represented by the line 121a, and variable gain amplifier 122 exhibits a substantially bent-linear input-output characteristic as represented by the line 122a. The compressed signal from variable gain amplifier 121 is supplied through a limiter circuit 60 which is identical to limiter circuit 60 of FIG. 11 and therefore will not be further described. The output from limiter circuit 60 is supplied to a positive input of an adding circuit 120 and the compressed signal from variable gain amplifier 122 is supplied to another positive input of adding circuit 120 where these signals are combined, as previously discussed in regard to FIGS. 7 and 9, so that a substantially linear compression input-output characteristic is obtained, as shown by the line 120a in FIG. 23. The combined signal from adding circuit 120 is supplied to an encoder output terminal 112a of gain control circuit 110 and to a control circuit 130 for providing respective control voltages for varying the gains of variable gain amplifiers 121 and 122. In particular, control circuit 130 may include a band-pass filter 215 in place of, or in addition to, band-pass filter 115, which is supplied with the output signal from adding circuit 120 and which, in turn, supplies an output signal therefrom to a weighting circuit 133 which weights the signal supplied thereto in accordance with the frequency of the signal. For example, weighting circuit 133 may be comprised of a high pass filter which weights the high frequency spectrum of the signal. The output of weighting circuit 133 is supplied to a level detecting circuit 134 which detects the level of the signal from weighting circuit 133 and produces a detected output signal in response thereto. Non-linear portions 131 and 132 of a non-linear circuit provide respective control voltages in response to the detected output signal for varying the gains of variable gain amplifiers 121 and 122, respectively, in much the same manner as non-linear circuit portions 43 and 44 of FIGS. 7 and 10. The output from adding circuit 120 is further supplied through a resistor 119 to the other fixed terminal b of switch 117 and to ground through resistor 119 and another resistor.

In operation, when the movable tap of switch 117 contacts fixed terminal a thereof, gain control circuit 110 acts as an encoder circuit and produces an output signal at output terminal 112a corresponding to the input information signal supplied to input terminal 111 but with its level compressed and the high frequency components thereof pre-emphasized. In other words, pre-emphasis circuit 116 pre-emphasizes the information signal and variable gain amplifiers 121 and 122 compress the pre-emphasized information signal in much the same manner as variable gain amplifiers 33 and 34 and non-linear circuit portions 43 and 44 of non-linear circuit 45 previously described with reference to FIGS. 7 and 10, whereby an input-output level characteristic for gain control circuit 110 is produced as shown by the line 110a of FIG. 23. However, when the movable tap of switch 117 contacts fixed terminal b thereof, gain control circuit 110 acts as a decoder circuit and produces a decoded output signal at output terminal 112b of operational amplifier 114.

It is to be appreciated that limiter circuit 60 positioned at the output side of variable gain amplifier 121 effectively suppresses any overshoots in the output signal from variable gain amplifier 121. Further, at the time when such overshoots are produced, the output from variable gain amplifier 122 is effectively supplied to output terminal 112a and accordingly, undesirable saturation of a magnetic tape is effectively avoided so that good sound quality from the reproduced signal is obtained. Further, spectral components in the low frequency range of the information signal, which are typically produced as a result of saturation of a magnetic tape, are substantially diminished so as to increase the resultant tonal quality. In addition, the input-output compression characteristic of the gain control circuit according to this invention is substantially linear so that a constant compression ratio over the entire range of input levels of the information signal is produced while the disadvantages inherent in the prior art circuits are eliminated.

Having described specific preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. In apparatus for recording an information signal on a recording medium by a recording device, gain control means comprising:
    means defining a first transmission path for compressing said information signal supplied thereto with a first gain characteristic;
    means defining a second transmission path separate from said first transmission path for compressing the same information signal supplied to said first transmission path with a second gain characteristic different from said first gain characteristic; and
    means for providing a substantially constant overall compression characteristic for said apparatus by effectively supplying the information signal to said recording device by way of said first transmission path when the amplitude of the information signal is below a predetermined value and for effectively supplying said information signal to said recording device by way of said second transmission path when the amplitude of said information signal is above said predetermined value, said means for providing including amplifier means having an input supplied with the compressed information signal from said first transmission path and with the compressed information signal from said second transmission path whereby said compressed information signal from said first transmission path and said compressed information signal from said second transmission path are added at the input of said amplifier means.

2. In apparatus for recording an information signal on a recording medium by a recording device, gain control means comprising:
    means defining a first transmission path for compressing said information signal supplied thereto with a first gain characteristic;
    means defining a second transmission path separate from said first transmission path for compressing the same information signal supplied to said first transmission path with a second gain characteristic different from said first gain characteristic, said means defining the first transmission path and said means defining the second transmission path including respective variable gain amplifier means having gains which vary in response to respective control signals supplied thereto, and each of which compresses said information signal as a function of said information signal;
    control means responsive to at least one of the compressed information signals from said variable gain amplifier means for producing said control signals; and
    means for providing a substantially constant overall compression characteristic for said apparatus by effectively supplying the information signal to said recording device by way of said first transmission path when the amplitude of the information signal is below a predetermined value and for effectively supplying said information signal to said recording device by way of said second transmission path when the amplitude of said information signal is above said predetermined value.

3. Apparatus according to claim 2; in which each of said variable gain amplifier means compresses said information signal in a logarithmic manner.

4. Apparatus according to claim 2; in which said control means includes level detecting means for detecting the level of at least one of said compressed information signals from said variable gain amplifier means and for producing a detected output signal in response thereto, and first and second non-linear means for producing said respective control signals in response to said detected output signal.

5. Apparatus according to claim 2; further including pre-emphasis means connected to said first and second transmission paths for pre-emphasizing the high frequency components of said information signal.

6. Apparatus according to claim 2; in which said means defining the first transmission path further includes limiter means for limiting said compressed information signal from said variable gain amplifier means thereof at two independent levels.

7. Apparatus according to claim 6; in which said limiter means includes at least one transistor having a collector-emitter path connected between the output of said variable gain amplifier means of said first transmission path and a reference potential.

8. Apparatus according to claim 2; in which each said variable gain amplifier means includes an amplifier having an input terminal and negative feedback resistive means connected to said input terminal for varying the gain of said amplifier.

9. In apparatus for recording an information signal on a recording medium by a recording device; gain control means comprising:
    means defining a first transmission path for compressing said information signal with a first gain characteristic;
    means defining a second transmission path for compressing said information signal with a second gain characteristic different from said first gain characteristic;
    said means defining the first transmission path and said means defining the second transmission path including respective variable gain amplifier means having gains which vary in response to respective control signals supplied thereto, and each of which compresses said information signal as a function of said information signal;
    means for effectively supplying the information signal to said recording device by way of said first transmission path when the level of the information signal is below a predetermined value and for effectively supplying said information signal to said recording device by way of said second transmission path when the level of said information signal is above said predetermined value; and
    control means responsive to the compressed information signals from at least one of said variable gain amplifier means for producing said control signals, said control means including level detecting means for detecting the level of said compressed information signals from at least one of said variable gain amplifier means and for producing a detected output signal in response thereto, and first and second non-linear means for producing said respective control signals in response to said detected output signal, and in which said first and second non-linear means have input-output level characteristics with first and second linear gradients, respectively, when the level of said detected output signal is less than a second predetermined value corresponding to the first-mentioned predetermined value, and third and fourth linear gradients, respectively, greater than said first and second gradients, respectively, when the level of said detected output signal is greater than said second predetermined value.

10. Apparatus according to claim 9; in which said first non-linear means includes first and second resistive elements forming a voltage divider for voltage dividing said detected output signal so as to produce said first linear gradient, and means for varying the resistance value of one of said resistive elements for changing the voltage dividing ratio of said voltage divider so as to produce said third linear gradient.

11. Apparatus according to claim 10; in which said means for varying the resistance value includes a series circuit of a diode, means for reverse biasing said diode and a third resistive element, and said series circuit is connected in parallel to said one resistive element.

12. Apparatus according to claim 9; in which said second non-linear means includes amplifier means having first and second input terminals and biasing means for producing a bias voltage, said detected output signal from said level detecting means is supplied to said first input terminal and said bias voltage is supplied to said second input terminal.

13. Apparatus according to claim 12; in which said second non-linear means includes gating means for transmitting a control signal to said variable gain amplifier means of said second transmission path when the level of said detected output signal supplied to said first input terminal is greater than the level of said bias voltage.

14. In apparatus for recording an information signal on a recording medium by a recording device; gain control means comprising:
    means defining a first transmission path for compressing said information signal with a first gain characteristic, said means defining the first transmission path including variable gain amplifier means having a gain which varies in response to a control signal supplied thereto and which compresses said information signal as a function of said information signal, and limiter means for limiting said compressed information signal from said variable gain amplifier means at two independent levels, said limiter means including at least one transistor having a collector-emitter path connected between the output of said variable gain amplifier means of said first transmission path and a reference potential, another transistor connected between the output of said variable gain amplifier means of said first transmission path and a reference potential, and a capacitive element connected between the output of said variable gain amplifier means and said transistors for imparting a frequency dependency to said limiter means;
    means defining a second transmission path for compressing said information signal with a second gain characteristic different from said first gain characteristic, said means defining the second transmission path including variable gain amplifier means having a gain which varies in response to a control signal supplied thereto and which compresses said information signal as a function of said information signal;
    means for effectively supplying the information signal to said recording device by way of said first transmission path when the level of the information signal is below a predetermined value and for effectively supplying said information signal to said recording device by way of said second transmission path when the level of said information signal is above said predetermined value; and control means responsive to the compressed information signals from at least one of said variable gain amplifier means for producing said control signals.

15. In apparatus for recording an information signal on a recording medium by a recording device, gain control means comprising:

means defining a first transmission path for compressing said information signal supplied thereto with a first gain characteristic;

means defining a second transmission path separate from said first transmission path for compressing the same information signal supplied to said first transmission path with a second gain characteristic different from said first gain characteristic, in which the slope of the first gain characteristic for levels of the information signal below a predetermined value is substantially equal to the slope of the second gain characteristic for levels of the information signal above said predetermined value; and means for providing a substantially constant overall compression characteristic for said apparatus by effectively supplying the information signal to said recording device by way of said first transmission path when the amplitude of the information signal is below said predetermined value and for effectively supplying said information signal to said recording device by way of said second transmission path when the amplitude of said information signal is above said predetermined value, whereby a substantially linear compression gain characteristic is produced by said gain control means.

16. In apparatus for recording an information signal on a recording medium by a recording device; gain control means comprising:

means defining a first transmission path compressing said information signal with a first gain characteristic;

means defining a second transmission path for compressing said information signal with a second gain characteristic different from said first gain characteristic;

said means defining the first transmission path and said means defining the second transmission path including respective variable gain amplifier means having gains which vary in response to respective control signals supplied thereto, and each of which compresses said information signal as a function of said information signal, each said variable gain amplifier means including an amplifier having an input terminal and negative feedback resistive means connected to said input terminal for varying the gain of said amplifier, in which each said negative feedback resistive means includes photoconductive means having a resistance value which varies in accordance with the amount of light irradiated thereon, and light emitting means for irradiating said photoconductive means in accordance with the level of the respective control signal supplied thereto;

means for effectively supplying the information signal to said recording device by way of said first transmission path when the level of the information signal is below a predetermined value and for effectively supplying said information signal to said recording device by way of said second transmission path when the level of said information signal is above said predetermined value; and control means responsive to the compressed information signals from at least one of said variable gain amplifier means for producing said control signals.

17. In apparatus for recording an information signal on a recording medium by a recording device; gain control means comprising:

means defining a first transmission path for compressing said information signal with a first gain characteristic, said means defining the first transmission path including variable gain amplifier means having a gain which varies in response to a control signal supplied thereto and which compresses said information signal as a function of said information signal, and limiter means for limiting said compressed information signal from said variable gain amplifier means at two independent levels, in which said limiter means includes a diode limiter circuit having first and second diodes connected in parallel between the output of said variable gain amplifier means of said first transmission path and a reference potential, and being arranged in opposing relation to each other;

means defining a second transmission path for compressing said information signal with a second gain characteristic different from said first gain characteristic, said means defining the second transmission path including variable gain amplifier means having a gain which varies in response to a control signal supplied thereto and which compresses said information signal as a function of said information signal;

means for effectively supplying the information signal to said recording device by way of said first transmission path when the level of the information signal is below a predetermined value and for effectively supplying said information signal to said recording device by way of said second transmission path when the level of said information signal is above said predetermined value; and control means responsive to the compressed information signals from at least one of said variable gain amplifier means for producing said control signals.

18. Apparatus according to claim 17; in which said limiter means further includes a capacitive element connected between said reference potential and said first and second diodes for providing a second reference potential higher than said first mentioned reference potential for low frequency components of said information signal.

* * * * *